United States Patent
Futakuchiya et al.

(10) Patent No.: US 6,180,931 B1
(45) Date of Patent: Jan. 30, 2001

(54) HEATER UNIT FOR SEMICONDUCTOR PROCESSING

(75) Inventors: Jun Futakuchiya; Takashi Masaki; Shinya Miyaji; Hidenori Ishiwata, all of Yokohama (JP)

(73) Assignee: NHK Spring Co., Ltd. (JP)

(*) Notice: Under 35 U.S.C. 154(b), the term of this patent shall be extended for 0 days.

(21) Appl. No.: 09/346,447

(22) Filed: Jul. 1, 1999

(30) Foreign Application Priority Data

Feb. 24, 1999 (JP) .................................................. 11-046004

(51) Int. Cl.$^7$ ...................................................... H05B 3/44
(52) U.S. Cl. ........................ 219/544; 219/444.1; 118/725
(58) Field of Search ............................ 219/443.1, 444.1, 219/449.1, 451.1, 465.1, 466.1, 467.1, 468.1, 468.2, 540, 544, 552; 118/724, 725, 728; 338/248, 249

(56) References Cited

U.S. PATENT DOCUMENTS

| | | | |
|---|---|---|---|
| 5,034,688 | * | 7/1991 | Moulene et al. ................... 219/444.1 |
| 5,314,541 | * | 5/1994 | Saito et al. ............................ 118/725 |
| 5,397,396 | * | 3/1995 | Kosky et al. ......................... 118/725 |
| 5,558,717 | * | 9/1996 | Zhao et al. ............................ 118/725 |
| 5,591,269 | * | 1/1997 | Arami et al. .......................... 118/725 |
| 5,595,241 | * | 1/1997 | Jelinek .................................. 118/725 |
| 5,635,093 | * | 6/1997 | Arena et al. .......................... 118/725 |
| 5,665,166 | * | 9/1997 | Deguchi et al. ...................... 118/725 |
| 5,904,872 | * | 5/1999 | Arami et al. .......................... 219/544 |

* cited by examiner

Primary Examiner—Teresa Walberg
Assistant Examiner—Fadi H. Dahbour
(74) Attorney, Agent, or Firm—Marger Johnson & McCollom, P.C.

(57) ABSTRACT

An upper metallic base is placed over a lower metallic base with a resistance heater element interposed between them so as to cause a plastic deformation to at least one of the opposing surfaces until the corresponding surfaces conform to an outer profile of the heater element, and the opposing surfaces of the lower and upper bases, and the resistance heater element are substantially entirely bonded to one another by a metallic bonding which may consist of brazing, soldering or diffusion bonding. Because the metallic bonding provides a favorable heat conduction, and can thereby improve the thermal efficiency and prevent local heating, a rapid temperature rise and uniform heating are made possible. Because the base consists of two parts, the material for the base can be selected from a wide range of materials including those capable of withstanding high temperatures and corrosive materials.

11 Claims, 4 Drawing Sheets

PRIOR ART

HEATER UNIT FOR SEMICONDUCTOR PROCESSING

TECHNICAL FIELD

The present invention relates to a heater unit for semiconductor processing, and in particular to a heater unit having a resistance heating element embedded in a metallic base. The present invention also relates to a method for producing such a heater unit.

BACKGROUND OF THE INVENTION

Conventionally, heater units having a resistance heating element embedded in a metallic base have been widely used in susceptors and electrostatic chucks for semiconductor processing. The resistance heating element typically consists of a sheath heater including a sheath tube made of stainless steel. Typically, a stainless steel sheath heater is cast into an aluminum base, clamped between a pair of aluminum or stainless plates, or interposed between a pair of plates which are joined together by welding along the outer edge.

FIG. 5 shows a conventional cast heater unit 10 including a base 11 having a stainless steel sheath heater 12 cast therein. The stainless steel sheath heater 12 typically comprises a stainless steel sheath pipe, a resistance heater wire received in the sheath pipe, and an insulator which electrically insulates the resistance heater wire from the sheath pipe. The sheath heater 12 is bent into a desired shape, and is cast into the aluminum base 11. The aluminum base 11 is then machined and polished to a desired finish.

FIG. 6 shows a conventional clamped heater unit 13. In this case, the metallic base consists of a lower base 14 and an upper base 15, each made of an aluminum or stainless steel plate. A sheath heater 12 is received in a groove 14a formed in the lower base 14, and the upper base 15 is placed closely over the lower base 14. The upper and lower bases 14 and 15 are then firmly joined with each other by fastening them together with threaded bolts.

FIG. 7 shows a conventional welded heater unit 16. In this case also, the metallic base consists of a lower base 17 and an upper base 18, each made of an aluminum or stainless steel plate. Likewise, a sheath heater 12 is placed in a groove 17a formed in the lower base 17, and the upper base 18 is placed closely over the lower base 17. The upper and lower bases 17 and 18 are then firmly joined with each other by welding them together along their edge 19.

A cast heater unit demonstrates a favorable heat conductivity owing to the close contact between the metallic base and the heating element. However, the metallic base is typically made of aluminum or an aluminum alloy which has a relatively low melting point (typically about 540° C.), and the cast heater unit using such a metallic base is therefore unsuitable for use in a high temperature environment exceeding 500° C. in temperature. Also, because the casting temperature of aluminum is higher than 700° C., the sheath pipe must be made of a high melting point material such as stainless steel and Inconel. Because the material of the sheath pipe differs in thermal expansion coefficient from the aluminum base, the resulting thermal stress may cause deformation to the heater element under a high temperature condition, and the repeated thermal stress may cause damage to the resistance heater wire and warping of the heater unit.

A clamped heater unit using an aluminum base can be used only in a same temperature range as a cast heater unit. But, because the sheath heater is retained by the base only physically, the repeated thermal stress is less likely to cause damage to the resistance heater wire. On the other hand, a certain gap is created in the groove, and this gap impairs heat transfer. In particular, the contact between the sheath heater and the base, and between the upper and lower bases is not very intimate, and this results in a poor thermal conductivity and localized temperature rises. Localized temperature rises are known to impair the durability of the resistance heater wire.

A welded heater unit is not much different from a clamped heater unit in these respects, and has the additional problem of distortion due to the heat at the time of welding.

BRIEF SUMMARY OF THE INVENTION

In view of such problems of the prior art, a primary object of the present invention is to provide a heater unit for semiconductor processing which is capable of quickly raising temperature, and heating uniformly.

A second object of the present invention is to provide a heater unit for semiconductor processing which allows a selection of materials from a wide range, and can be therefore adapted for use in high temperature environments.

A third object of the present invention is to provide a heater unit for semiconductor processing which is durable in use.

A fourth object of the present invention is to provide a method for fabricating such a heater in both economical and reliable manner.

According to the present invention, these and other objects can be accomplished by providing a heater unit, comprising; a lower metallic base; an upper metallic base placed closely over an upper surface of the lower base; and a resistance heater element interposed in a groove defined between opposing surfaces of the lower and upper bases; wherein the opposing surfaces of the lower and upper bases, and the resistance heater element are substantially entirely bonded to one another by a metallic bonding which may consist of brazing, soldering or diffusion bonding.

The metallic bonding provides a favorable heat conduction, and can thereby improve the thermal efficiency and prevent local heating. It also allows rapid temperature rises, and uniform heating. Because the base consists of two parts, the material for the base can be selected from a wide range of materials including those capable of withstanding high temperatures and corrosive materials. Preferably, the resistance heater element comprises a sheath heater including a metallic sheath pipe, resistance heater wire received in the sheath pipe, and insulating material filled in the sheath pipe so as to electrically insulate the resistance heater wire from the sheath pipe. The material for the metallic sheath pipe may be selected from a group consisting of aluminum, aluminum alloys, copper, copper alloys, stainless steels, nickel, chromium and iron alloys, such as Inconel®, titanium and titanium alloys. Also, the upper and lower bases may each consist of a material selected from a group consisting of aluminum, aluminum alloys, copper, copper alloys, stainless steels, nickel-based alloys, titanium and titanium alloys.

The method for fabricating the heater unit of the present invention may comprise the steps of: preparing a lower base having a planar top surface; preparing an upper base having a planar bottom surface; placing the upper base over the lower base with a resistance heater element interposed between the top and bottom surfaces of the lower and upper bases so as to cause a plastic deformation to at least one of the top and bottom surfaces of the lower and upper bases until the corresponding surface conform to an outer profile of the heater element, and causing the opposing surfaces of the lower and upper bases, and the resistance heater element substantially entirely bonded to one another by a metallic bonding. The plastic deformation of at least one of the top and bottom surfaces of the lower and upper bases ensures a close contact between the opposing surfaces of the lower and upper bases and the resistance heater element.

The opposing surfaces of the lower and upper bases may consist of simple planar surfaces, and the resistance heater element may be received in a groove which is formed by plastic deformation of at least one of the opposing surfaces of the lower and upper bases. But, more preferably, at least one of the top surface of the lower base and the bottom surface of the upper base is provided with a groove for substantially closely receiving the resistance heater element prior to the plastic deformation. This allows the proper positioning of the resistance heater wire during the fabrication process, and the proper selection of the extent of the plastic deformation that is optimum for attaining both the ease of fabrication and a favorable heat transfer. According to a particularly preferred embodiment of the present invention, only one of the top surface of the lower base and the bottom surface of the upper base is provided with a groove for substantially closely receiving only a part of a cross section of the sheath heater prior to the plastic deformation so as leave a remaining cross sectional part of the heater element exposed, and the other surface is adapted to conform to the remaining cross sectional part of the heater element by plastic deformation to thereby achieve a close contact between the opposing surfaces of the lower and upper bases.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
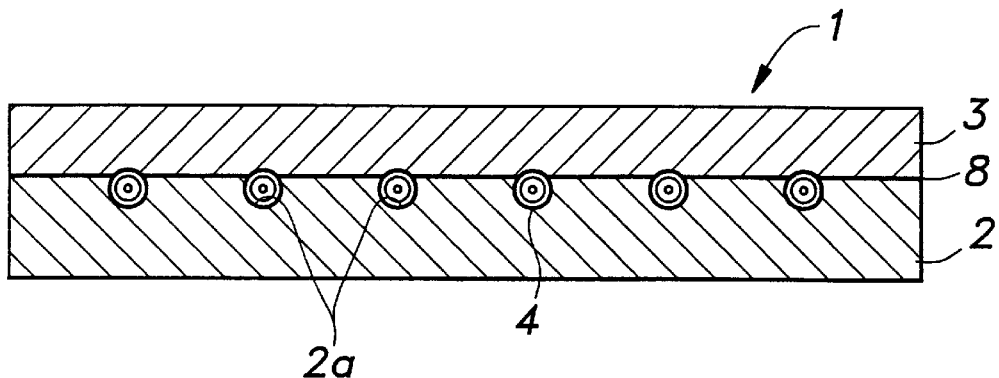
FIG. 1 is a sectional view showing the structure of a bonded heater unit embodying the present invention.

In FIG. 1 is shown a heater unit embodying the present invention which is suitable for use in CVD chambers and other situations in semiconductor manufacturing processes. This heater unit 1 comprises a lower base 2, an upper base 3 placed over the lower base 2, and a sheath heater 4 received in a groove 2a formed in the lower base 2. The lower base 2 may be made of a suitable material such as aluminum, aluminum alloys, copper, copper alloys, stainless steels, nickel-based alloys, titanium and titanium alloys. The upper base 3 may be similarly selected, but may be made of either a same material or a material different from that of the lower base 2. As more fully described hereinafter, the upper and lower bases, and the sheath heater are mutually and integrally bonded along the interfaces denoted by numeral 8 to one another by brazing, soldering or diffusion bonding.

Figure 2:
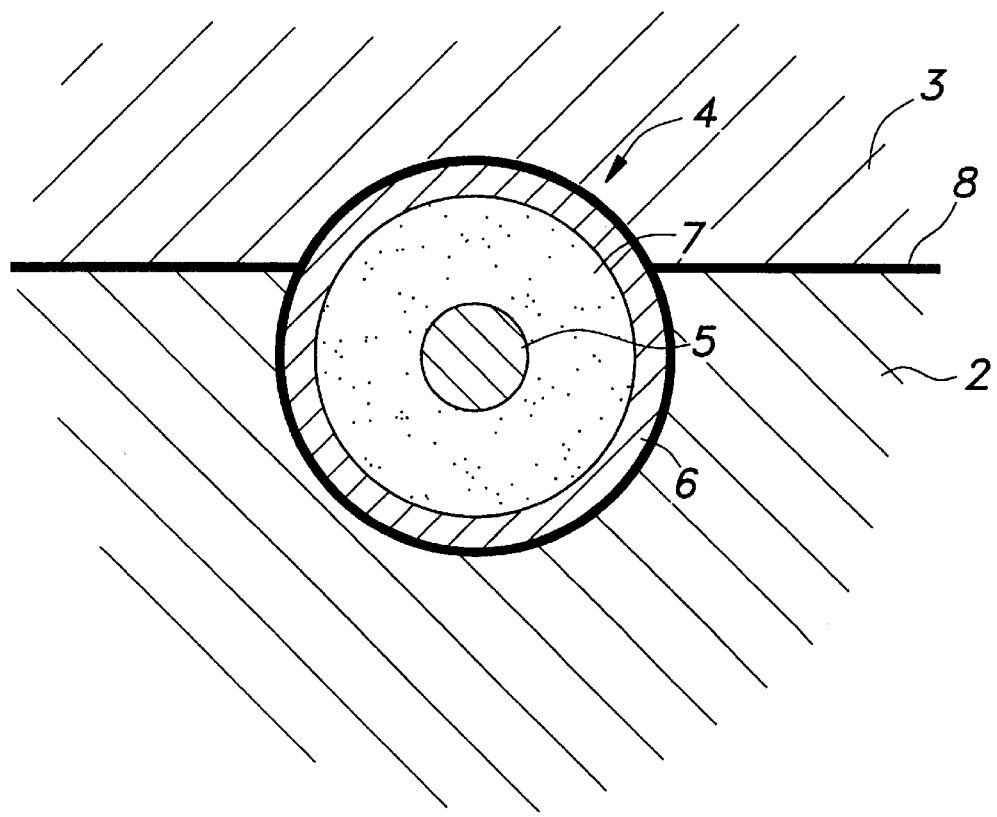
FIG. 2 is an enlarged sectional view of the resistance heater element of FIG. 1.

Referring to FIG. 2, the sheath heater 4 comprises a sheath pipe 6 consisting of a material selected from a group consisting of aluminum, aluminum alloys, copper, copper alloys, stainless steels, Inconel, titanium and titanium alloys, resistance heater wire 5 consisting of nichrom wire passed through the sheath pipe, and magnesia powder filled in the sheath pipe 6 to electrically insulate the resistance heater wire 5 from the sheath pipe 6. When the material for the sheath pipe 6 consists of a material which has a thermal expansion coefficient similar to those of the lower and upper bases 2 and 3, it is possible to minimize thermal stress and distortion when subjected to repeated heating and cooling.

Figure 3:
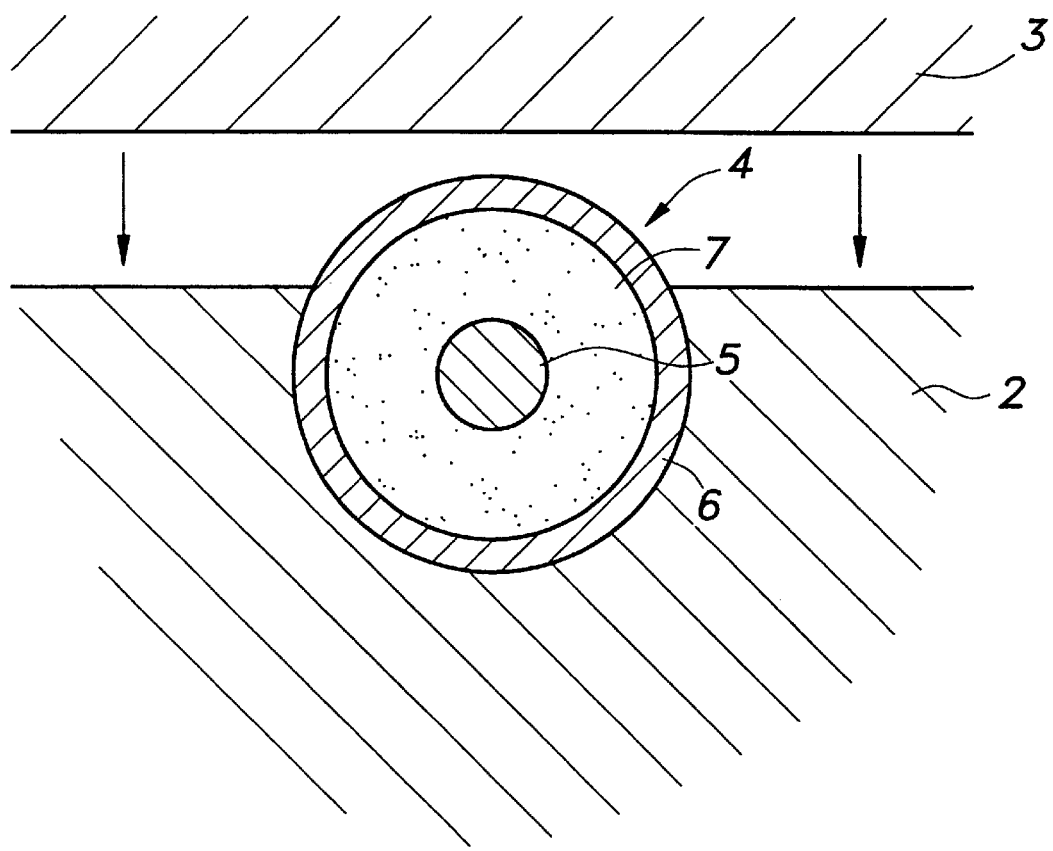
FIG. 3 is a view similar to FIG. 2 showing an intermediate stage in making the heater unit.

The process of making the bonded heater unit 1 is now described in the following with reference to FIG. 3. The dimensions and cross sectional shape of the groove 2a in the lower base 2a are determined in such a manner that when the sheath heater 4 is pressed into the groove 2a, the upper part of the sheath heater 4 is exposed out of the groove 2a while the lower part of the sheath heater 4 is closely received in the groove 2a. Initially, no such groove is defined in the upper base 3.

In case of a bonded structure based on brazing or soldering, brazing material or solder is applied to the inner surface of the groove 2a before pressing the sheath heater element 4 into the groove 2a as well as to the opposing surfaces of the lower and upper bases 2 and 3. Thereafter, the upper base 3 is pressed onto the lower base 2 in a vacuum, nitrogen or other inert environment, and the upper base 3 is caused to undergo a plastic deformation, and to be bonded to the lower base 2 so as to achieve a metallic bonding via the brazing material or the solder as the case may be. Thereby, the state illustrated in FIG. 2 is attained. In other words, the opposing surfaces of the upper and lower bases 2 and 3, and the sheath heater 4 are mutually and integrally bonded to one another over the entire interfaces as opposed to the clamped heater unit and the welded heater unit in which the lower and upper bases are joined with each other only in the areas of threaded bolts and along the outer periphery, respectively. The illustrated embodiment additionally provides the advantage of achieving a favorable contact between the sheath heater and the opposing surfaces of the lower and upper bases. Therefore, the efficiency in heat transfer can be significantly improved, and the heat output can be maximized with the given heat output of the sheath heater. Also, localized heating can be avoided, and this improves the durability of the sheath heater element.

Figure 4:
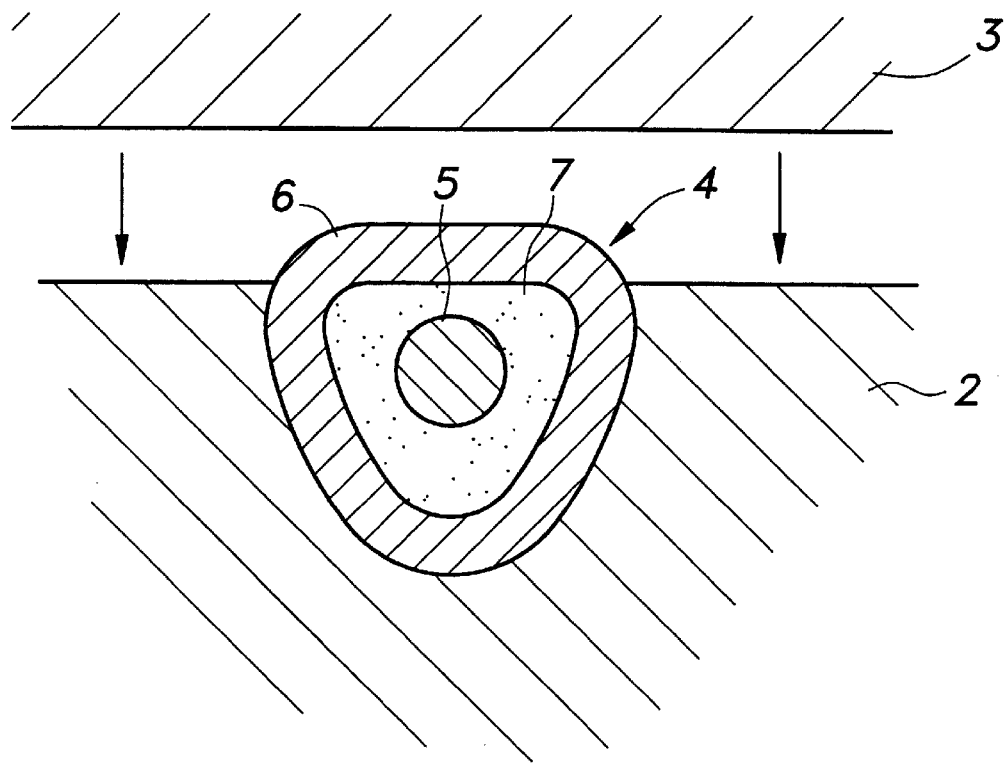
FIG. 4 is a view similar to FIG. 3 showing an alternate embodiment of the present invention.
Figure 5:
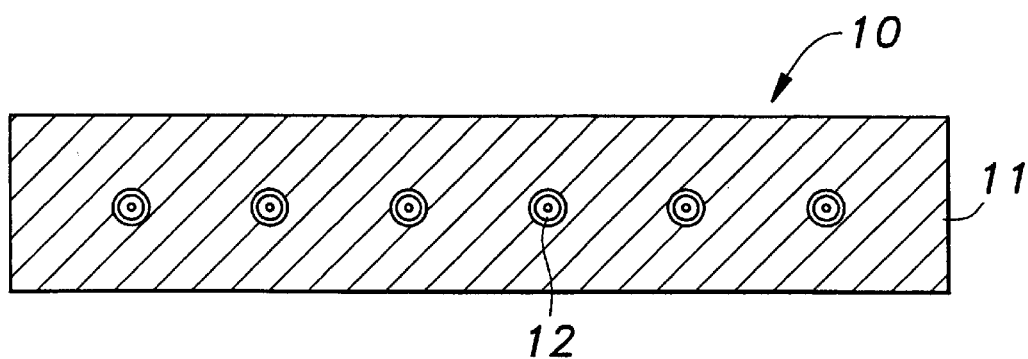
FIG. 5 is a sectional view of a conventional cast heater unit.
Figure 6:
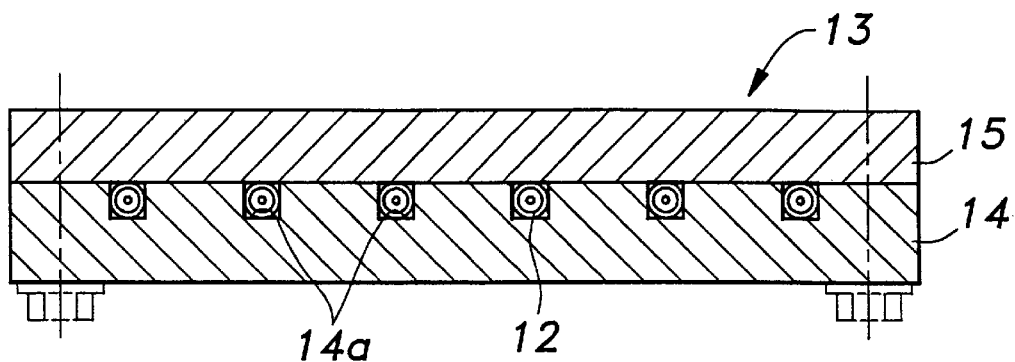
FIG. 6 is a sectional view of a conventional clamped heater unit.
Figure 7:
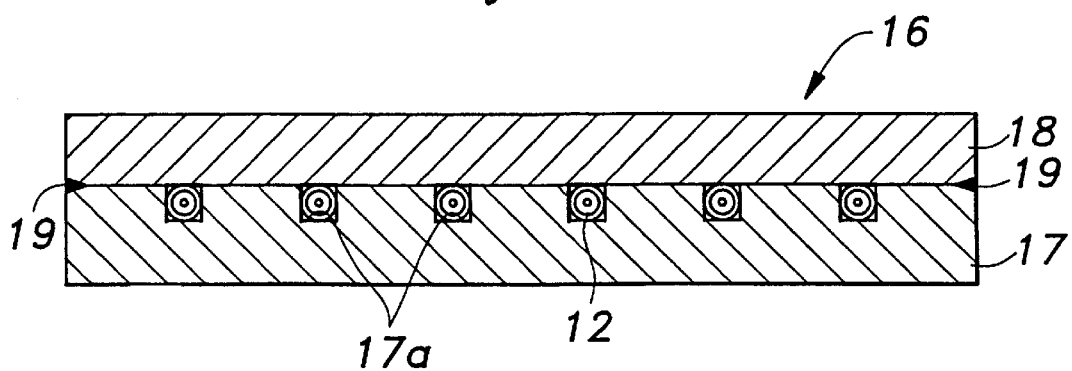
FIG. 7 is a sectional view of a conventional welded heater unit.

In the above described embodiment, the brazing material or the solder was used for achieving the metallic bonding, but the same goal can be achieved without relying on a brazing material or solder by applying a suitable pressure and placing the assembly under a suitable condition for diffusion bonding. Also, the sheath heater had a circular cross section in the above described embodiment, but may also have other cross sections such as the triangular cross section illustrated in FIG. 4. The shape of the base can be freely selected. Also, the diffusion bonding and the press fitting of the sheath heater element can be conducted simultaneously.

Although the present invention has been described in terms of preferred embodiments thereof, it is obvious to a person skilled in the art that various alterations and modifications are possible without departing from the scope of the present invention which is set forth in the appended claims.

We claim:

1. A heater unit, comprising:

a lower metallic base;

an upper metallic base placed closely over an upper surface of said lower base; and a resistance heater element interposed in a groove defined between opposing surfaces of said lower and upper bases, wherein said resistance heater element comprises a sheath heater including a metallic sheath pipe, resistance heater wire received in said sheath pipe, and insulating material filled in said sheath pipe so as to electrically insulate said resistance heater wire from said sheath pipe;

wherein said opposing surfaces of said lower and upper bases, and said resistance heater element are substantially entirely bonded to one another by a metallic bonding;

wherein said upper metallic base is plastically deformed in a way that said opposing surfaces of said lower and upper bases, and said resister heater element are mutually and integrally bonded to one another over substantially the entire interfaces thereof.

2. A heater unit according to claim 1, wherein said metallic bonding consists of a member selected from a group consisting of brazing, soldering and diffusion bonding.

3. A heater unit according to claim 1, wherein said metallic sheath pipe consists of a material selected from a group consisting of aluminum, aluminum alloys, copper, copper alloys, stainless steels, nickel, chromium and iron alloys, titanium and titanium alloys.

4. A heater unit according to claim 1, wherein said upper and lower bases each consist of a material selected from a group consisting of aluminum, aluminum alloys, copper, copper alloys, stainless steels, nickel-based alloys, titanium and titanium alloys.

5. A method of fabricating a heater unit, comprising the steps of:

preparing a lower metallic base having a planar top surface;

preparing an upper metallic base having a planar bottom surface, said upper metallic base being plastically deformable;

placing said upper base over said lower base with a resistance heater element interposed between said top and bottom surfaces of said lower and upper bases;

pressing said plastically deformable upper base to cause a plastic deformation to at least one of said top and bottom surfaces of said lower and upper bases until the corresponding surface conform to an outer profile of said heater element, and causing said opposing surfaces of said lower and upper bases, and said resistance heater element to be bonded to one another by a metallic bonding over substantially the entire interfaces thereof, said resistance heater element comprising a sheath heater including a metallic sheath pipe, resistance heater wire received in said sheath pipe, and insulating material filled in said sheath pipe so as to electrically insulate said resistance heater wire from said sheath pipe.

6. A method according to claim 5, wherein said metallic bonding consists of a member selected from a group consisting of brazing, soldering and diffusion bonding.

7. A method according to claim 5, wherein said metallic sheath pipe consists of a material selected from a group consisting of aluminum, aluminum alloys, copper, copper alloys, stainless steels, nickel, chromium and iron alloys, titanium and titanium alloys.

8. A method according to claim 5, wherein said upper and lower bases each consist of a material selected from a group consisting of aluminum, aluminum alloys, copper, copper alloys, stainless steels, nickel-based alloys, titanium and titanium alloys.

9. A method according to claim 5, wherein at least one of said top surface of said lower base and said bottom surface of said upper base is provided with a groove for substantially closely receiving said resistance heater element prior to said plastic deformation.

10. A method according to claim 5 wherein only one of said top surface of said lower base and said bottom surface of said upper base is provided with a groove for substantially closely receiving only a part of a cross section of said sheath heater prior to said plastic deformation so as to leave a remaining cross sectional part of said heater element exposed, and the other surface is adapted to conform to the remaining cross sectional part of said heater element by plastic deformation to thereby achieve a close contact between the opposing surfaces of said lower and upper bases.

11. The heater unit of claim 1, wherein the upper part of the metallic sheath pipe is exposed out of the groove defined in the lower base.

* * * * *